United States Patent
Park

(10) Patent No.: US 11,585,833 B2
(45) Date of Patent: Feb. 21, 2023

(54) PROBE CARD HAVING POWER CONVERTER AND TEST SYSTEM INCLUDING THE SAME

(71) Applicant: SAMSUNG ELECTRONICS CO., LTD., Suwon-si (KR)

(72) Inventor: Sehoon Park, Gwangju (KR)

(73) Assignee: Samsung Electronics Co., Ltd., Suwon-si (KR)

(*) Notice: Subject to any disclaimer, the term of this patent is extended or adjusted under 35 U.S.C. 154(b) by 0 days.

(21) Appl. No.: 17/498,820

(22) Filed: Oct. 12, 2021

(65) Prior Publication Data

US 2022/0341967 A1   Oct. 27, 2022

(30) Foreign Application Priority Data

Apr. 23, 2021 (KR) .................. 10-2021-0052973

(51) Int. Cl.
*G01R 31/28* (2006.01)
*G01R 1/073* (2006.01)

(52) U.S. Cl.
CPC ..... *G01R 1/07342* (2013.01); *G01R 31/2863* (2013.01); *G01R 31/2865* (2013.01); *G01R 31/2875* (2013.01)

(58) Field of Classification Search
CPC ............ G01R 1/07307; G01R 1/07342; G01R 31/26; G01R 31/2642; G01R 31/2648; G01R 31/2831; G01R 31/31702
See application file for complete search history.

(56) References Cited

U.S. PATENT DOCUMENTS

| | | | |
|---|---|---|---|
| 7,271,604 B2 | 9/2007 | Reitinger | |
| 8,680,880 B2 | 3/2014 | Kiyofuji et al. | |
| 10,295,590 B2 | 5/2019 | Saito et al. | |
| 2006/0158207 A1 | 7/2006 | Reitinger | |
| 2009/0273358 A1* | 11/2009 | Arkin ................ | G01R 1/07307 324/756.03 |
| 2010/0164520 A1 | 7/2010 | Kiyofuji et al. | |
| 2017/0248632 A1 | 8/2017 | Thompson et al. | |

(Continued)

FOREIGN PATENT DOCUMENTS

| | | |
|---|---|---|
| JP | 2010109816 A2 | 4/2007 |
| JP | 2009059875 A2 | 3/2009 |

(Continued)

*Primary Examiner* — Tung X Nguyen
(74) *Attorney, Agent, or Firm* — Volentine, Whitt & Francos, PLLC

(57) ABSTRACT

A probe card includes a sub-board, having a heating layer, connected to a probe pin. A main board is connected to the sub-board and includes a first output terminal configured to output first power received from a first power supply to the heating layer in a first mode. A power converter is configured to lower a first voltage corresponding to residual power received from the first power supply to a second voltage and output the residual power in a second mode. A second output terminal is configured to receive the residual power from the power converter and second power from a second power supply and output third power including the residual power and the second power to a device under test in the second mode. A first switch unit is connected to the first power supply, the first output terminal, and the power converter.

28 Claims, 10 Drawing Sheets

(56) References Cited

U.S. PATENT DOCUMENTS

2017/0363680 A1 12/2017 Saito et al.
2021/0055328 A1* 2/2021 Joo ..................... G01R 27/205

FOREIGN PATENT DOCUMENTS

| JP | 2010164490 A | 7/2010 |
| JP | 5258590 B9 | 5/2013 |
| KR | 20140060401 A | 5/2014 |
| KR | 101412742 B1 | 6/2014 |
| KR | 102012797 B1 | 8/2019 |
| KR | 100144299 A | 12/2020 |

* cited by examiner

PROBE CARD HAVING POWER CONVERTER AND TEST SYSTEM INCLUDING THE SAME

CROSS-REFERENCE TO THE RELATED APPLICATION

This application claims priority from Korean Patent Application No. 10-2021-0052973, filed on Apr. 23, 2021, in the Korean Intellectual Property Office, the disclosure of which is incorporated herein by reference in its entirety.

BACKGROUND

1. Field

The disclosure relates to a probe card and a test system including the same.

2. Description of the Related Art

A wafer test system includes a probe card having probe pins for electrical contact with pads on a wafer. The wafer test system supplies power for testing to a device under test (DUT), that is, a semiconductor device in the wafer through the probe card. To maximize throughput, the wafer test system may test several semiconductor devices at the same time by splitting power. As more semiconductor devices are tested, power is also split into more branches, and due to a limited power capacity, available current per semiconductor device decreases in inverse proportion to an increase in the number of semiconductor chips.

SUMMARY

The exemplary embodiments of the disclosure provide a probe card which increases a power capacity required for testing and a test system including the same.

A probe card in accordance with an embodiment of the disclosure may include a sub-board including a heating layer and connected to a probe pin. A main board is connected to the sub-board and includes a first output terminal configured to output first power received from a first power supply to the heating layer in a first mode. A power converter is configured to lower a first voltage corresponding to residual power received from the first power supply to a second voltage and output the residual power in a second mode. A second output terminal is configured to receive the residual power from the power converter and second power from a second power supply and output third power including the residual power and the second power to a device under test in the second mode. A first switch unit is connected to the first power supply, the first output terminal, and the power converter. The first switch unit may be selectively switched to: (1) the first mode in which the first switch unit electrically connects the first power supply and the heating layer to each other and (2) the second mode in which the first switch unit electrically connects the first power supply and the power converter to each other.

A test system in accordance with an embodiment of the disclosure may include a prober including a first power supply, an automated test equipment (ATE) including a second power supply, and a probe card. The probe card includes a heating layer, and a probe pin. A first output terminal is configured to output first power having a first voltage received from the first power supply to the heating layer in a first mode. A first power converter is configured to lower the first voltage corresponding to residual power received from the first power supply to a second voltage and output the residual power in a second mode. A second output terminal is configured to receive the residual power having the second voltage from the first power converter and second power having the second voltage from the second power supply and output third power including the residual power and the second power to a device under test through the probe pin.

A test system in accordance with an embodiment of the disclosure may include a prober including a first power supply, an ATE including a second power supply and a third power supply, a sub-board including a heating layer therein and connected to a probe pin, and a main board connected to the sub-board through an interposer. The main board may include a first output terminal configured to output first power having a first voltage received from the first power supply to the heating layer in a first mode. A first power converter is configured to lower the first voltage corresponding to residual power received from the first power supply to a second voltage in a second mode. A second output terminal is configured to receive the residual power from the first power converter and second power from the second power supply and output third power including the residual power and the second power to a device under test through the probe pin in the second mode. A second power converter is configured to lower the first voltage corresponding to the residual power received from the first power supply to a third voltage in a third mode. A third output terminal is configured to receive the residual power from the second power converter and fourth power from the third power supply and output fifth power including the residual power and the fourth power to the device under test through the probe pin in the third mode. A first switch unit is connected to the first power supply, the first output terminal, and the first power converter. A second switch unit is connected to the first power supply and the second power converter. After the first switch unit operates in the first mode in which the first switch unit electrically connects the first power supply and the first output terminal to each other, the first switch unit may operate in the second mode in which the first switch unit electrically connects the first power supply and the first power converter to each other or in the third mode in which the first switch unit electrically connects the first power supply and the second power converter to each other.

DETAILED DESCRIPTION OF EXEMPLARY EMBODIMENTS

Figure 1:
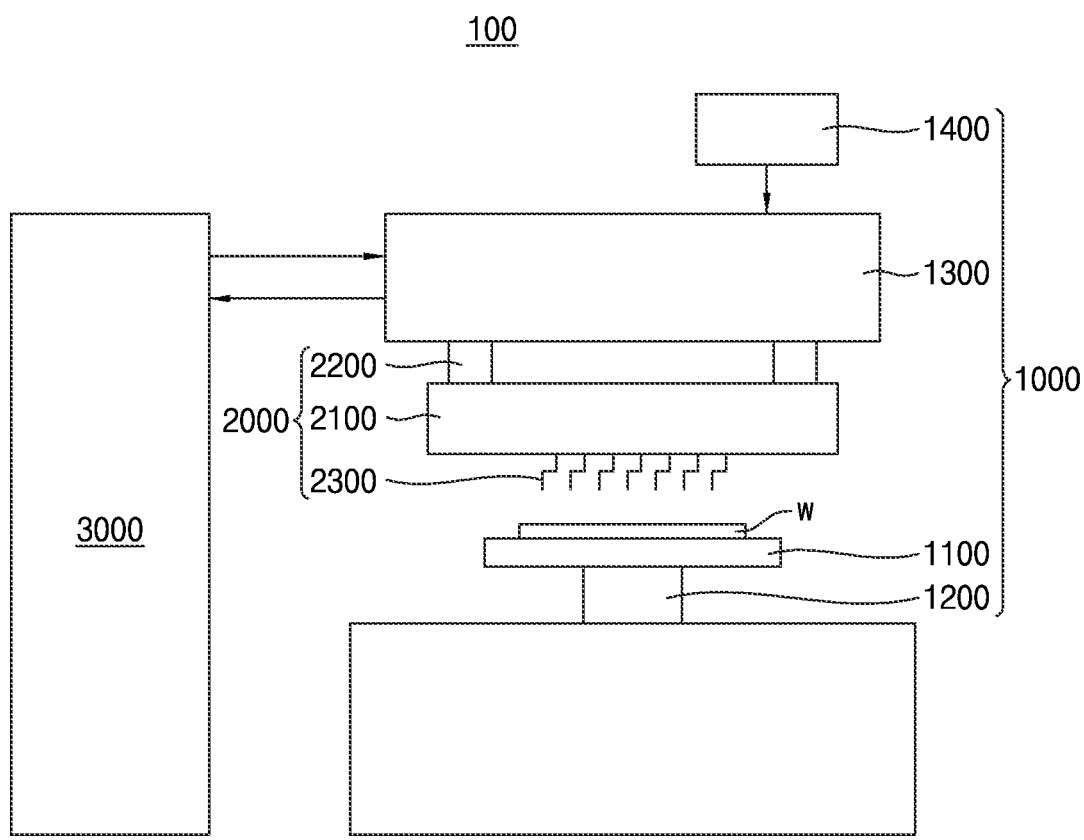
FIG. 1 is a side view illustrating a test system according to an embodiment of the disclosure.

FIG. 1 is a side view illustrating a test system according to an embodiment of the disclosure.

Referring to FIG. 1, a test system 100 may include a prober 1000, a probe card 2000, and an automated test equipment (ATE) 3000. A wafer W including a device under test DUT may be disposed on the prober 1000, and the probe card 2000 may be electrically and physically connected to the prober 1000.

The ATE 3000 may be electrically connected to the prober 1000. The ATE 3000 may generate power and a test signal for testing the device under test DUT and transmit the power and the input test signal to the device under test DUT through the prober 1000 and the probe card 2000. The wafer W including the device under test DUT may receive the power and the input test signal and be driven based on the received test signal.

For example, when a manufacturing process for a semiconductor device is completed, the electrical characteristics of the manufactured semiconductor device may be measured to determine pass or fail of the semiconductor device. The ATE 3000 may generate the input test signal to check whether the device under test DUT is passed or failed, such as a logic or a memory semiconductor device. The device under test DUT may perform a predetermined operation in response to the received input test signal. The device under test DUT may generate an output test signal as a result signal of the predetermined operation. The ATE 3000 may receive the output test signal and determine whether the device under test DUT is passed or failed based on the output test signal.

The probe card 2000 may be an intermediate medium connecting the ATE 3000 and the device under test DUT to each other. The input test signal generated from the ATE 3000 may be transmitted to the device under test DUT through the probe card 2000. The output test signal generated from the device under test DUT may also be transmitted to the ATE 3000 through the probe card 2000. In an embodiment, the output test signal generated from the device under test DUT may be transmitted to the ATE 3000 through a separate interface instead of the probe card 2000.

The prober 1000 may include a wafer chuck 1100, a chuck driver 1200, a test head 1300, and a power supply 1400. The wafer W including the device under test DUT may be disposed on the wafer chuck 1100. The wafer chuck 1100 may be moved horizontally, moved vertically, and/or rotated by the chuck driver 1200. As the wafer chuck 1100 is raised by the chuck driver 1200, the wafer W and the probe card 2000 may be brought into electrical connection.

The test head 1300 may be located over the wafer chuck 1100. The test head 1300 may be electrically connected to the ATE 3000 to receive the input test signal for testing the wafer W from the ATE 3000. The test head 1300 may also receive the output test signal as a result of testing and transmit the output test signal to the ATE 3000. The test head 1300 may be electrically connected to the probe card 2000. The test head 1300 may transmit the input test signal to the wafer W through the probe card 2000 and receive the output test signal from the wafer W through the probe card 2000. The test head 1300 may have a built-in test circuit therein and include slots into which a plurality of test cards are inserted.

The power supply 1400 may be electrically connected to the probe card 2000 through the test head 1300. The power supply 1400 may supply power to the probe card 2000 to heat and expand the probe card 2000, which will be described in detail with reference to FIG. 2.

The probe card 2000 may include a body 2100, a ZIF connector 2200, and a probe pin 2300. The probe card 2000 may be electrically and physically connected to the test head 1300 through the ZIF connector 2200. The probe card 2000 may receive the input test signal from the test head 1300 or transmit the output test signal to the test head 1300 through the ZIF connector 2200.

The probe card 2000 may be electrically connected to the wafer W through the probe pin 2300. As the wafer chuck 1100 moves upward and thus the wafer W comes into contact with the probe pin 2300, the probe pin 2300 and the wafer W may be electrically connected. The probe card 2000 may transmit the input test signal received through the test head 1300 to the wafer W through the probe pin 2300. The probe card 2000 may receive the output test signal generated from the wafer W through the probe pin 2300.

Figure 2:
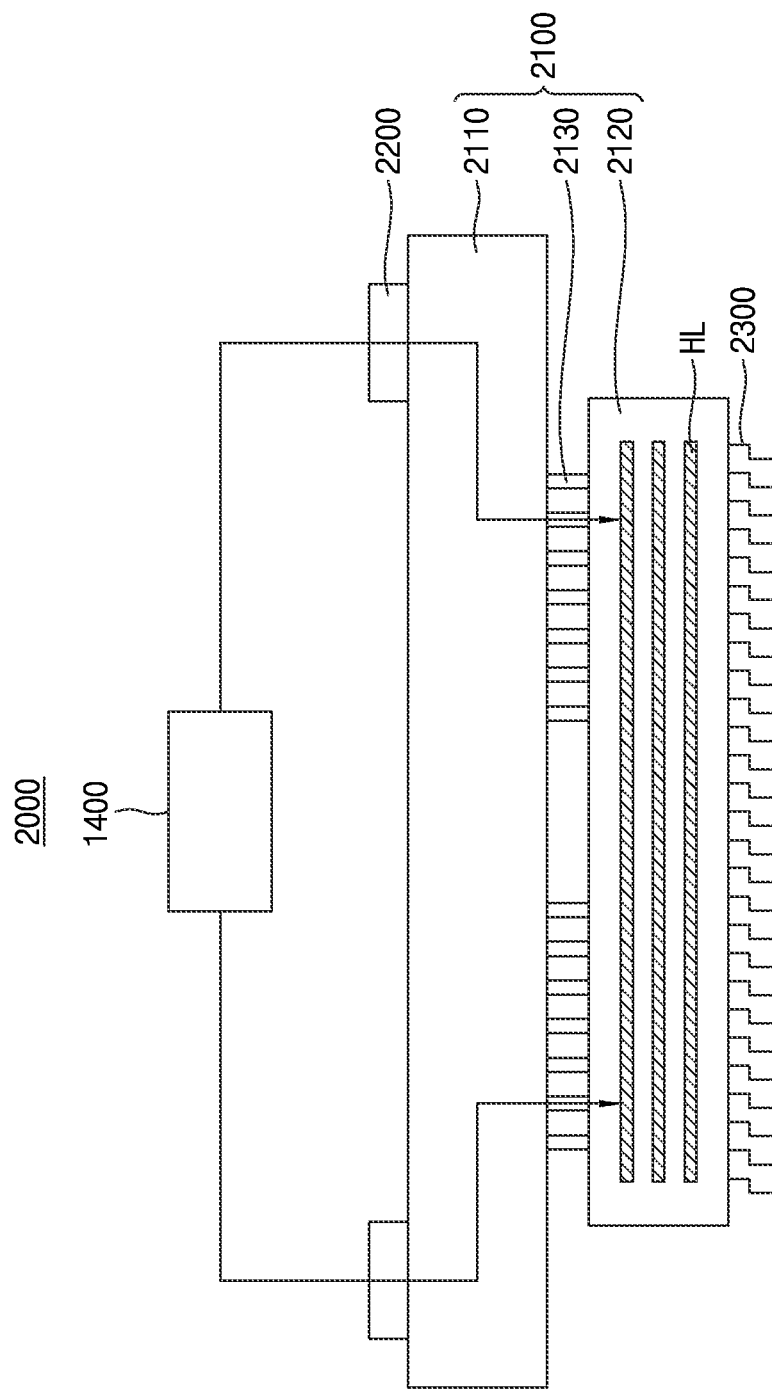
FIG. 2 is a sectional view illustrating the probe card according to an embodiment of the disclosure.

FIG. 2 is a sectional view illustrating the probe card according to an embodiment of the disclosure.

Referring to FIGS. 1 and 2, the body 2100 of the probe card 2000 may include a main board 2110, a sub-board 2120, and interposers 2130.

The main board 2110 may be a printed circuit board (PCB). The main board 2110 may include various electronic circuits to transmit electrical signals. For example, the main board 2110 may include various relay components such as a direct current (DC) relay and a power relay, for parallel testing.

The sub-board 2120 may be connected to the main board 2110. The sub-board 2120 may be electrically and physically connected to the main board 2110 through the interposers 2130. For example, the sub-board 2120 may be a multi-layer ceramic (MLC) board or a single-layer ceramic (SLC) board. The sub-board 2120 may include at least one heating layer HL therein. The heating layer HL may include a metal. The heating layer HL may be electrically connected to the power supply 1400 of the prober 1000 through the interposers 2130 and the main board 2110. The heating layer HL may be electrically connected to the power supply 1400 of the prober 1000 through the ZIF connector 2200. The heating layer HL may be electrically connected to the power supply 1400 of the prober 1000 through the test head 1300 of the prober 1000.

The power supply 1400 may supply power to the heating layer HL to heat the heating layer HL. As the heating layer HL is heated, the heating layer HL may radiate heat to the sub-board 2120 and expand the sub-board 2120. To test the wafer W at a high temperature, the wafer chuck 1100 may heat the wafer W after the wafer W is placed on the wafer chuck 1100. The heated wafer W expands. The probe pin 2300 should contact a pad provided on the wafer W, for electrical connection to the wafer W. However, due to the expansion of the wafer W, the relative position of the pad of the wafer W to which the probe pin 2300 will come into contact may change. Accordingly, the power supply 1400 of the prober 1000 may supply power to the heating layer HL to expand the sub-board 2120 to which the probe pin 2300 is connected in correspondence with the expansion of the wafer W. In this manner, the probe pin 2300 may be aligned with the pad of the wafer W to contact the pad of the wafer W even in a high-temperature test.

Figure 3:
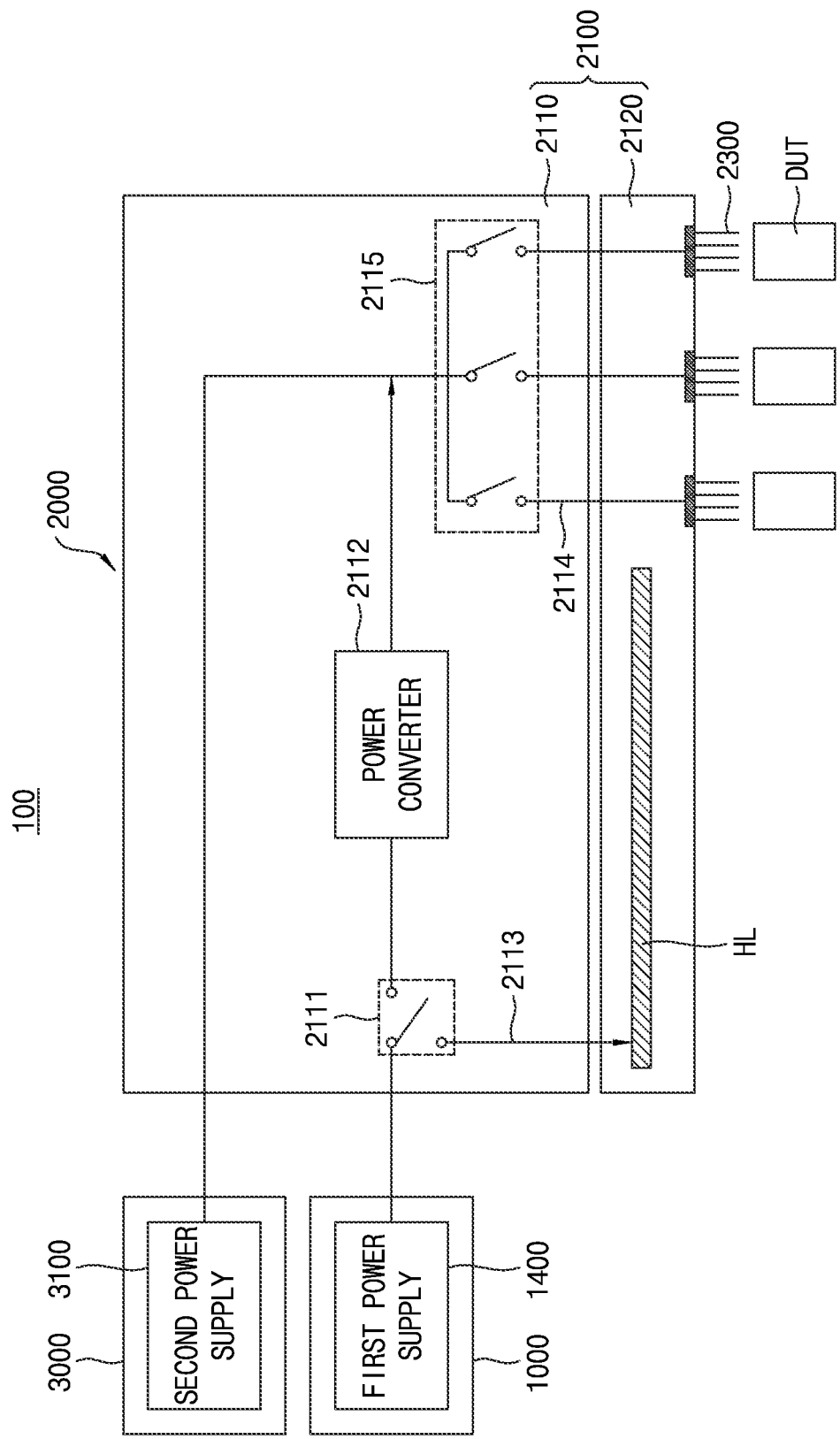
FIG. 3 is a diagram illustrating a test system according to an embodiment of the disclosure.
Figure 4:
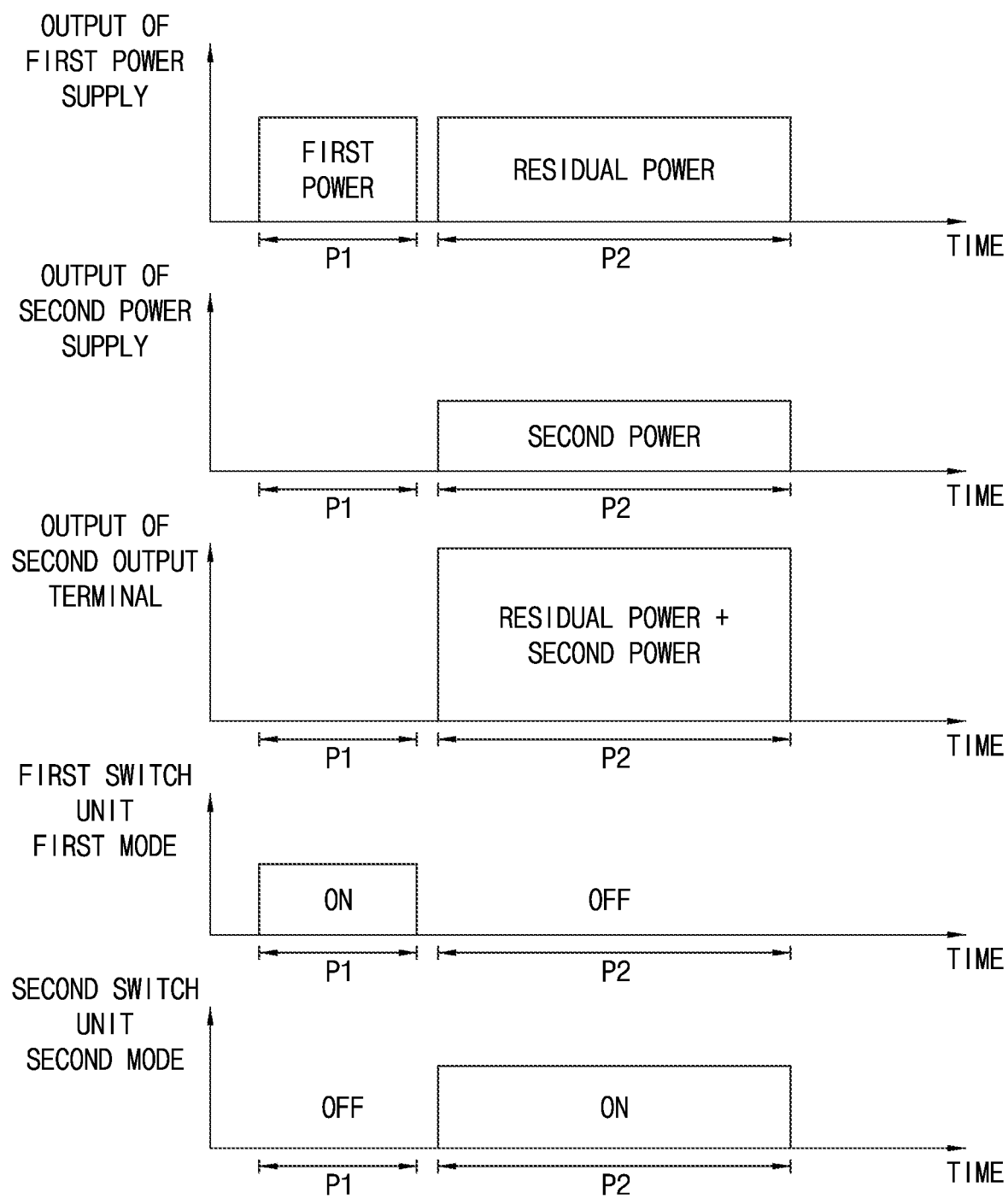
FIG. 4 is a diagram illustrating power output from a power supply and an output terminal of the test system during each period according to modes illustrated in FIG. 3.

FIG. 3 is a diagram illustrating a test system according to an embodiment of the disclosure. FIG. 4 is a diagram illustrating power output from a power supply and an output terminal of the test system during each period according to modes illustrated in FIG. 3.

Referring to FIGS. 3 and 4, the test system 100 may include the prober 1000, the probe card 2000, and the ATE 3000. The prober 1000 may include a first power supply 1400. The first power supply 1400 may be a switching mode power supply (SMPS). The first power supply 1400 may supply first power to the probe card 2000. For example, the first power supply 1400 may supply the first power to the probe card 2000 through the test head 1300 of the prober 1000. A voltage level corresponding to the first power supplied by the first power supply 1400 may be a first voltage.

The ATE 3000 may include a second power supply 3100. The second power supply 3100 may be a programmable power supply (PPS). The second power supply 3100 may supply second power to the probe card 2000. For example, the second power supply 3100 may supply the second power to the probe card 2000 through the test head 1300 (refer to FIG. 1) of the prober 1000. A voltage level corresponding to the second power supplied by the second power supply 3100 may be a second voltage. The second voltage may be lower than the first voltage.

The probe card 2000 may include the main board 2110 and the sub-board 2120. The main board 2110 may include a first switch unit 2111, a power converter 2112, a first output terminal 2113, and a second output terminal 2114. The sub-board 2120 may include a heating layer HL therein and may be physically connected to the probe pin 2300.

The first switch unit 2111 may be electrically connected to the first power supply 1400, the first output terminal 2113, and the power converter 2112. The first output terminal 2113 may electrically connect the first switch unit 2111 and the heating layer HL to each other. The second output terminal 2114 may be electrically connected to the power converter 2112 and the second power supply 3100. The second output terminal 2114 may electrically connect the power converter 2112 and the second power supply 3100 to a probe pin 2300.

The test system 100 may further include a controller (not shown) to generate a mode signal that controls the first power supply 1400, the second power supply 3100, and the probe card in a first mode or a second mode. The first power supply 1400, the second power supply 3100, and the probe card 2000 of the test system 100 may operate in the first mode or the second mode based on the mode signal. For example, the first switch unit 2111 may operate in the first mode or the second mode based on the mode signal. That is, the first switch unit 2111 may be selectively switched to the first mode or the second mode. For example, the first switch unit 2111 may receive the mode signal from a controller (not shown) included in the main board 2110. Alternatively, the first switch unit 2111 may receive the mode signal from a controller included in the prober 1000 or the ATE 3000.

In the first mode, the first switch unit 2111 may electrically connect the first power supply 1400 and the heating layer HL to each other. In the first mode, the first switch unit 2111 may electrically connect the first power 1400 and the heating layer HL through the first output terminal 2113. In the first mode, the first power supply 1400 and the power converter 2112 may be open therebetween. In the first mode, the first power supply 1400 may supply the first power having the first voltage to the heating layer HL through the first switch unit 2111 and the first output terminal 2113. In the first mode, the first output terminal 2113 may output the first power received from the first power supply 1400 to the heating layer HL.

The first mode may be maintained during a first period P1. The first period P1 may be a time period during which the sub-board 2120 is heated and expanded by supplying first power having the first voltage to the heating layer HL. During the first period P1, the first switch unit 2111 may operate in the first mode, so that the first power supply 1400 applies the first voltage and supplies the first power to the heating layer HL through the first output terminal 2113. The heating layer HL may be heated by the first power. As the heating layer HL is heated, the sub-board 2120 may be heated and expanded.

In the second mode, the first switch unit 2111 may electrically connect the first power supply 1400 and the power converter 2112 to each other. In the second mode, the first power supply 1400 and the heating layer HL may be open therebetween. In the second mode, the first power supply 1400 may supply residual power except for the first power supplied to the heating layer HL in the total power of the first power supply 1400 to the power converter 2112 through the first switch unit 2111. A voltage level corresponding to the residual power supplied by the first power supply 1400 may be the first voltage.

In the second mode, the power converter 2112 may receive the first power having the first voltage from the first power supply 1400 through the first switch unit 2111. In the second mode, the power converter 2112 may lower the first voltage corresponding to the residual power received from the first power supply 1400 to the second voltage. In the second mode, the power converter 2112 may output the residual power having the second voltage to a second output terminal 2114. The second voltage may be a voltage level required to test the device under test DUT.

In the second mode, the second output terminal 2114 may receive the residual power from the power converter 2112 and the second power from the second power supply 3100 and output third power including the residual power and the second power to the device under test DUT. The second output terminal 2114 may be electrically connected to the probe pin 2300 and transmit the third power to the device under test DUT through the probe pin 2300 contacting with the device under test DUT. Because the residual power of the first power supply 1400 as well as the second power of the second power supply 3100 included in the ATE 3000 is provided during testing of the device under test DUT, required current may be smoothly provided even though the number of devices under test DUT increases.

The second mode may be maintained during a second period P2 after the first period P1. The second period P2 may be a time period during which the device under test DUT is tested. The second power supply 3100 and the power converter 2112 may apply the second voltage and supply the second power to the device under test DUT through the second output terminal 2114 to test the device under test DUT during the second period P2 in which the first switch unit 2111 operates in the second mode. The second power supply 3100 may not supply the second power during the first period P1 in which the first switch unit 2111 operates in the first mode.

In an embodiment, the probe card 2000 may further include a second switch unit 2115. The second switch unit 2115 may be located between the power converter 2112 and the second output terminal 2114 and between the second power supply 3100 and the second output terminal 2114. The second switch unit 2115 may be connected to the power converter 2112, the second power supply 3100, and the second output terminal 2114. The second switch unit 2115 may be switched to an on-state or an off-state according to a control signal from the controller included in the probe card 2000, the prober 1000, or the ATE 3000 to control supply or non-supply of power to the second power terminal 2114.

In an embodiment, the second switch unit 2115 may be placed in the off-state in the first mode and in the on-state in the second mode. That is, the second switch unit 2115 may electrically connect the power converter 2112 and the second power supply 3100 to the second output terminal 2114 in the second mode and may open between the power converter 2112 and the second output terminal 2114 and between the second power supply 3100 and the second output terminal 2114 in the first mode.

Figure 5:
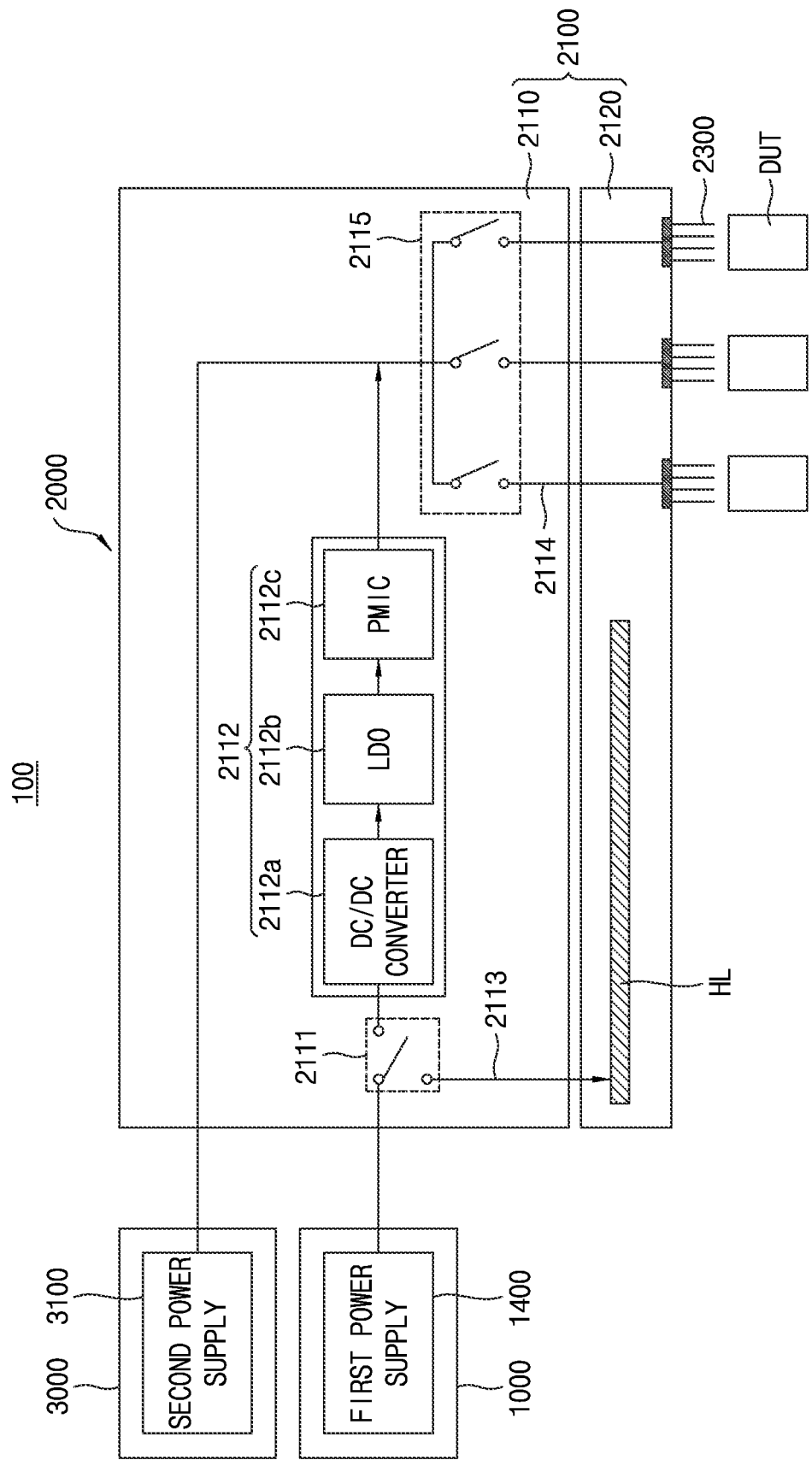
FIG. 5 is a diagram illustrating a test system according to an embodiment of the disclosure.

FIG. 5 is a diagram illustrating a test system according to an embodiment of the disclosure. In FIG. 5, the same reference numerals as those in FIG. 3 denote the same components and a description redundant to the foregoing description will be avoided.

Referring to FIG. 5, the power converter 2112 may include a direct current/direct current (DC/DC) converter 2112a, a low drop-out regulator (LDO) 2112b, and a power management integrated circuit (PMIC) 2112c. The DC/DC converter 2112a may be connected to the first switch unit 2111, the PMIC 2112c may be connected to the second output terminal 2114, and the LDO 2112b may be connected between the DC/DC converter 2112a and the PMIC 2112c. In this case, the DC/DC converter 2112a may lower the first voltage of the residual power to a first intermediate voltage, the LDO 2112b may lower the first intermediate voltage to a second intermediate voltage, and the PMIC 2112c may adjust the second intermediate voltage to the second voltage and output the second voltage to the second output terminal 2114. The second voltage may be a voltage level required for testing the device under test DUT.

In an embodiment, the power converter 2112 may include at least one of the DC/DC converter 2112a, the LDO 2112b, or the PMIC 2112c. When the power converter 2112 includes the DC/DC converter 2112a and one of the LDO 2112b and the PMIC 2112c, the DC/DC converter 2112a may be connected to the first switch unit 2111, and the LDO 2112b or the PMIC 2112c may be interposed between the DC/DC converter 2112a and the second output terminal 2114. In this case, the DC/DC converter 2112a may lower the first voltage of the residual power to an intermediate voltage, and the LDO 2112b or the PMIC 2112c may lower the intermediate voltage to the second voltage and output the second voltage to the second output terminal 2114.

Figure 6:
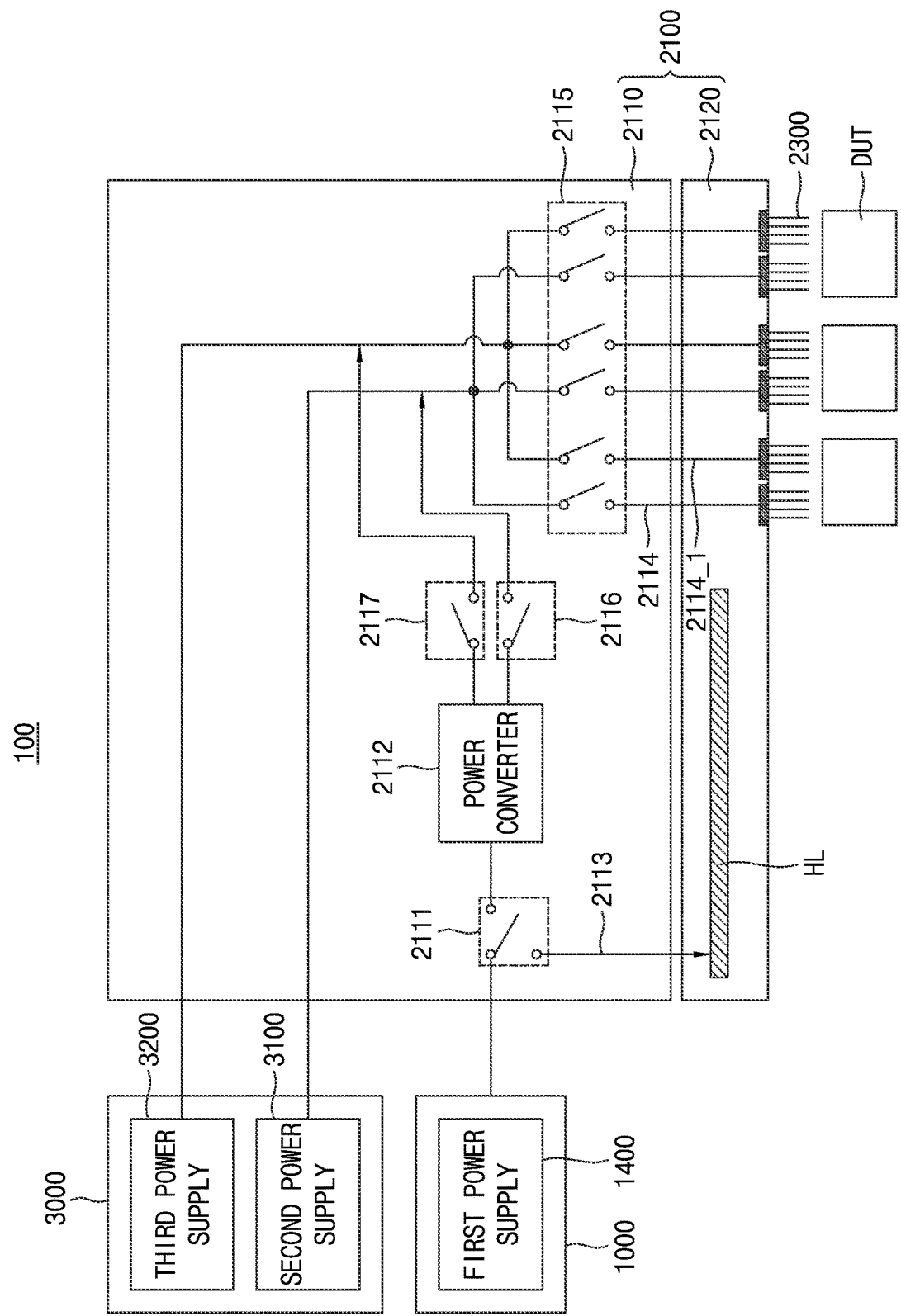
FIG. 6 is a diagram illustrating a test system according to an embodiment of the disclosure.

FIG. 6 is a diagram illustrating a test system according to an embodiment of the disclosure. In FIG. 6, the same reference numerals as those in FIGS. 3 and 5 denote the same components and a description redundant to the foregoing descriptions will be avoided.

Referring to FIG. 6, the ATE 3000 may include a plurality of power supplies 3100 and 3200. In an embodiment, the ATE 3000 may include the second power supply 3100 and a third power supply 3200. The second power supply 3100 and the third power supply 3200 may supply power to the probe card 2000, respectively. The power supplied by the second power supply 3100 and the power supplied by the third power supply 3200 may have different voltages. The second power supply 3100 may supply the second power having the second voltage, and the third power supply 3200 may supply third power having a third voltage. Each of the second voltage and the third voltage may be a voltage level required to test the device under test DUT.

The probe card 2000 may include a plurality of output terminals 2114 and 2114_1 and a plurality of switch units 2116 and 2117 electrically connected to a plurality of output terminals 2114 and 21141, respectively. In an embodiment, the probe card 2000 of FIG. 6 may further include a third output terminal 21141, a third switch unit 2116, and a fourth switch unit 2117, compared to the probe card 2000 of FIG. 3. The third switch unit 2116 may be positioned between the power converter 2112 and the second output terminal 2114. The third switch unit 2116 may be connected to the power converter 2112 and the second output terminal 2114. The fourth switch unit 2117 may be positioned between the power converter 2112 and the third output terminal 2114_1. The fourth switch unit 2117 may be connected to the power converter 2112 and the third output terminal 2114_1.

The first power supply 1400, the second power supply 3100, the third power supply 3200, and the probe card 2000 included in the test system 100 may operate in the first mode, the second mode, or a third mode based on a mode signal. For example, the first switch unit 2111, the third switch unit 2116, and the fourth switch unit 2117 may operate in any one of the first mode, the second mode, and the third mode based on the mode signal. Each of the first switch unit 2111, the third switch unit 2116, and the fourth switch unit 2117 may receive the mode signal from the controller (not shown) included in the main board 2110. Alternatively, each of the first switch unit 2111, the third switch unit 2116, and the fourth switch unit 2117 may receive the mode signal from the controller (not shown) included in the prober 1000 or the ATE 3000.

In the first mode, the first switch unit 2111 may electrically connect the first power supply 1400 and the heating layer HL to each other. In the first mode, the third switch unit 2116 and the fourth switch unit 2117 may be in the off-state. That is, in the first mode, the power converter 2112 and the second output terminal 2114 may be open therebetween, and the power converter 2112 and the third output terminal 2114_1 may be open therebetween.

In the second mode, the first switch unit 2111 may electrically connect the first power supply 1400 and the power converter 2112 to each other. In the second mode, the first switch unit 2111 may open between the first power supply 1400 and the heating layer HL, that is, between the first power supply 1400 and the first output terminal 2113. In the second mode, the first power supply 1400 may supply the first power out of the total power of the first power supply 1400 to the heating layer HL and the residual power to the power converter 2112 through the first switch unit 2111. The first switch unit 2111 may operate in the second mode to transfer the residual power to the power converter 2112. A voltage level corresponding to the residual power provided by the first power supply 1400 may be the first voltage.

In the second mode, the third switch unit 2116 may be in the on-state, and the fourth switch unit 2117 may be in the off-state. When the third switch unit 2116 is in the on-state, the power converter 2112 may be electrically connected to the second output terminal 2114. When the fourth switch unit 2117 is in the off-state, the power converter 2112 and the third output terminal 2114_1 may be open therebetween.

In the second mode, the power converter 2112 may output the residual power received from the first power supply 1400 to the second output terminal 2114 through the third switch unit 2116. In the second mode, the power converter 2112 may lower the first voltage of the residual power to the second voltage and output the second voltage. In the second mode, while the first power supply 1400 is supplying the residual power to the second output terminal 2114 through the first switch unit 2111, the power converter 2112, and the third switch unit 2116, simultaneously, the second power supply 3100 may supply the second power to the second output terminal 2114. The second output terminal 2114 may receive the residual power and the second power, and output fourth power including the residual power and the second power to the device under test DUT.

In the third mode, the first switch unit 2111 may electrically connect the first power supply 1400 and the power converter 2112 to each other. In the third mode, the third switch unit 2116 may be in the off-state and the fourth switch unit 2117 may be in the on-state. When the third switch unit 2116 is in the off-state, the power converter 2112 and the second output terminal 2114 may be open therebetween. When the fourth switch unit 2117 is in the on-state, the power converter 2112 and the third output terminal 2114_1 may be electrically connected to each other.

In the third mode, the power converter 2112 may output the residual power received from the first power supply 1400 to the third output terminal 2114_1 through the fourth switch unit 2117. In the third mode, the power converter 2112 may lower the first voltage of the residual power to a third voltage and output the third voltage. In the third mode, while the first power supply 1400 is supplying the residual power to the third output terminal 2114_1 through the first switch unit 2111, the power converter 2112, and the fourth switch unit 2117, the third power supply 3200 may supply the third power to the third output terminal 2114_1. The third output terminal 2114_1 may receive the residual power and the third power, and output fifth power including the residual power and the third power to the device under test DUT.

In an embodiment, the probe card 2000 may operate in the second mode or the third mode after operating in the first mode. After the probe card 2000 operates in one of the second mode and the third mode, the probe card 2000 may operate in the other mode. For example, the first power supply 1400 may supply a portion of the residual power to the second output terminal 2114 in the second mode, and supply at least a portion of residual power remaining after being used in the second mode to the third output terminal 2114_1 in the third mode.

During the first period, for example, the first switch unit 2111 may operate in the first mode, so that the first power supply 1400 applies the first voltage to the heating layer HL through the first output terminal 2113 and heats and expands the sub-board 2120. During the second period after the first period, the first switch unit 2111, the third switch unit 2116, and the fourth switch unit 2117 may operate in the second mode, so that the power converter 2112 and the second power supply 3100 applies the second voltage to the device under test DUT through the second output terminal 2114 and thus test the device under test DUT. During a third period after the second period, the first switch unit 2111, the third switch unit 2116, and the fourth switch unit 2117 may operate in the third mode, so that the power converter 2112 and the third power supply 3200 apply the third voltage to the device under test DUT through the third output terminal 2114_1 and thus test the device under test DUT.

Figure 7:
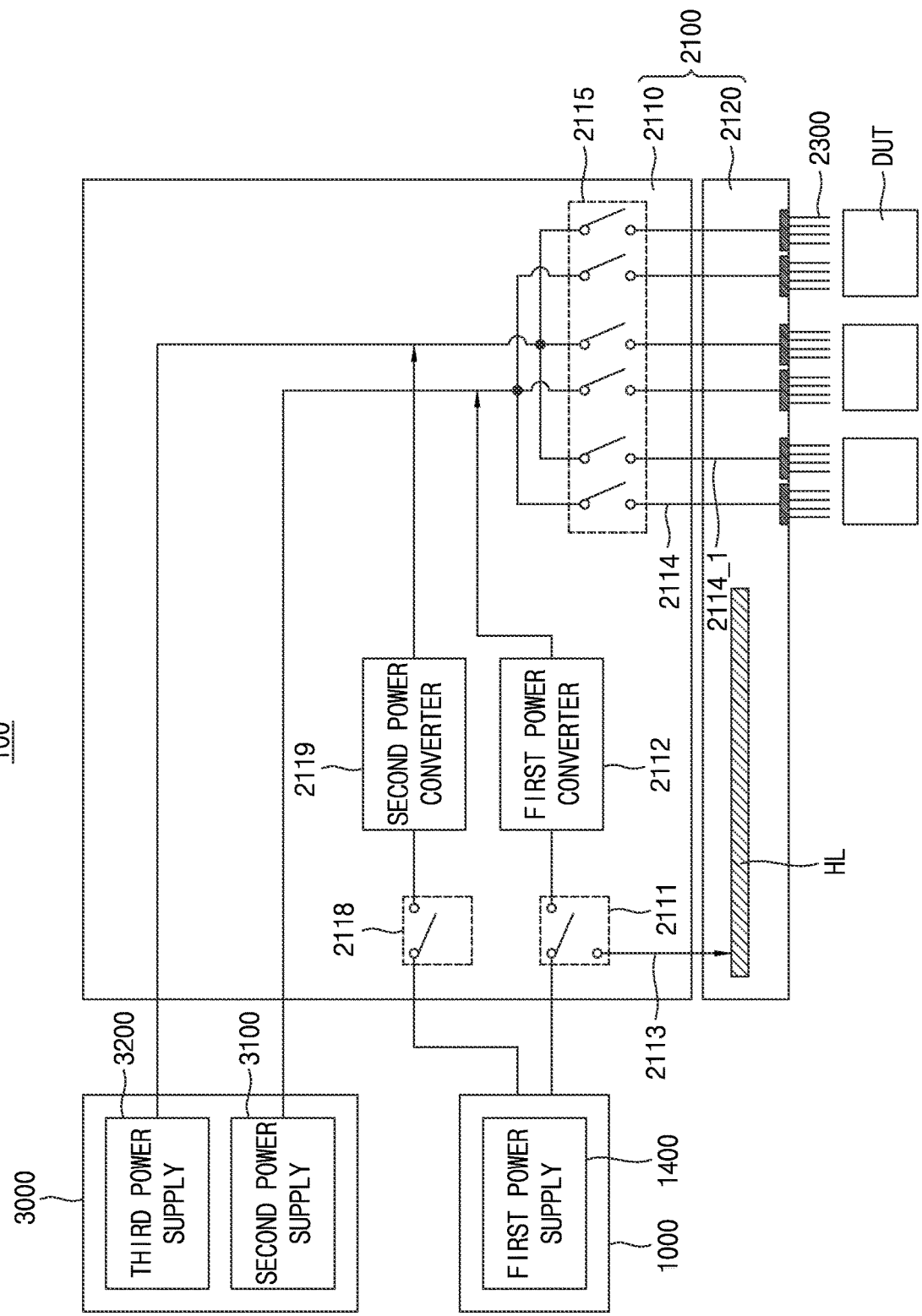
FIG. 7 is a diagram illustrating a test system according to an embodiment of the disclosure.

FIG. 7 is a diagram illustrating a test system according to an embodiment of the disclosure. In FIG. 7, the same reference numerals as those of FIGS. 3, 5, and 6 denote the same components and a description redundant to the foregoing descriptions will be avoided.

Referring to FIG. 7, compared to the probe card 2000 of FIG. 6, the probe card 2000 may further include a third switch unit 2118 and a second power converter 2119, instead of the third switch unit 2116 and the fourth switch unit 2117. The third switch unit 2118 may be positioned between the first power supply 1400 and the second power converter 2119 and connected to the first power supply 1400 and the second power converter 2119. The second power converter 2119 may be connected to the third output terminal 2114_1.

The first power supply 1400, the second power supply 3100, the third power supply 3200, and the probe card 2000 included in the test system 100 may operate in the first mode, the second mode, or the third mode. In the first mode, the first power having the first voltage from the first power supply 1400 may be supplied to the heating layer HL. In the first mode, the first switch unit 2111 may electrically connect the first power supply 1400 and the first output terminal 2113 to each other and open between the first power supply 1400 and the first power converter 2112. In the first mode, the third switch unit 2118 may be in the off-state. That is, in the first mode, the first power supply 1400 and the second power converter 2119 may be open therebetween.

The first power supply 1400, the second power supply 3100, the third power supply 3200, and the probe card 2000 may operate in the second mode and/or the third mode after operating in the first mode. In the second mode, the residual power having the first voltage from the first power supply 1400 may be supplied to the first power converter 2112 through the first switch unit 2111. In the second mode, the first power converter 2112 may lower the first voltage corresponding to the residual power to the second voltage and output the second voltage to the second output terminal 2114. In the second mode, the first power supply 1400 and the first output terminal 2113 may be open therebetween. In the second mode, the third switch unit 2118 may be in the off-state. In the second mode, a part of the second switch unit 2115 connected to the second output terminal 2114 may be in the on-state, and a part of the second switch unit 2115 connected to the third output terminal 2114_1 may be in the off-state. In the second mode, the second power supply 3100 may supply the second power having the second voltage to the second output terminal 2114. The second output terminal 2114 may output the fourth power including the residual power having the second voltage and the second power received through the first power converter 2112 to the device under test DUT to test the device under test DUT.

In the third mode, the residual power having the first voltage from the first power supply 1400 may be supplied to the second power converter 2119 through the third switch unit 2118. In the third mode, the second power converter 2119 may lower the first voltage corresponding to the residual power to the third voltage and output the third voltage to the third output terminal 2114_1. In the third mode, the first switch unit 2111 may open between the first power supply 1400 and the first output terminal 2113 and between the first power supply 1400 and the first power converter 2112. In the third mode, a part of the second switch unit 2115 connected to the third output terminal 2114_1 may be in the on-state, and a part of the second switch unit 2115 connected to the second output terminal 2114 may be in the off-state. In the third mode, the third power supply 3200 may supply the fourth power having the third voltage to the third output terminal 2114_1. The third output terminal 2114_1 may output the fifth power including the fourth power and the residual power having the third voltage received through the second power converter 2119 to the device under test DUT and test the device under test DUT.

Figure 8:
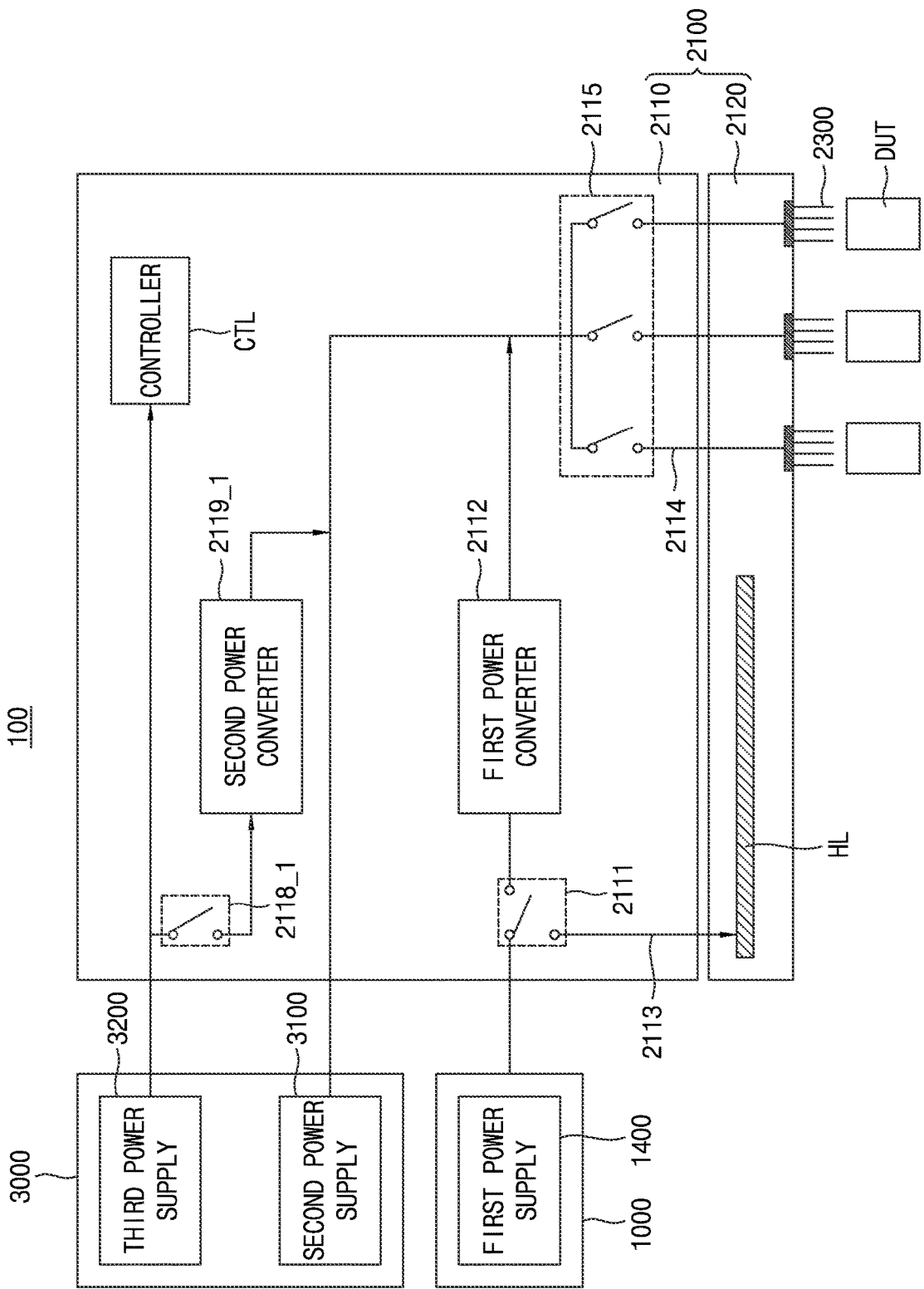
FIG. 8 is a diagram illustrating a test system according to an embodiment of the disclosure.

FIG. 8 is a diagram illustrating a test system according to an embodiment of the disclosure. In FIG. 8, the same reference numerals as those of FIGS. 3 and 5 to 7 denote the same components and a description redundant to the foregoing descriptions will be avoided.

Referring to FIG. 8, the test system 100 differs from the test system 100 of FIG. 3 in that the ATE 3000 further includes a third power supply 3200 and the probe card 2000 further includes a controller CTL, a second power converter 21191, and a third switch 2118_1.

The third power supply 3200 may supply the fourth power having the third voltage to the controller CTL of the probe card 2000. The controller CTL of the probe card 2000 may be a component that provides overall control to the probe card 2000. The controller CTL may control the probe card 2000 to operate in any one of the first mode, the second mode, and the third mode. For example, the controller CTL may output a mode signal that controls the first switch unit 2111, the second switch unit 2115, and the third switch unit 2118_1 to operate in any one of the first mode, the second mode, and the third mode, which should not be construed as limiting the function of the controller CTL. For example, the controller CTL may be a field programmable gate array (FPGA).

In the second mode, the third switch unit 2118_1 may be in the on-state. That is, in the second mode, the third switch unit 2118_1 may electrically connect the third power supply 3200 to the second power converter 2119. In the second mode, the third power supply 3200 may supply the fifth power having the third voltage to the second output terminal 2114. In the second mode, the third power supply 3200 may supply the fifth power having the third voltage to the second output terminal 2114 through the third switch unit 2118_1 and the second power converter 2119. In the second mode, the second power converter 2119 may convert the third voltage corresponding to the fifth power received from the third power supply 3200 to the second voltage and output the second voltage to the second output terminal 2114. In the second mode, the second output terminal 2114 receives the residual power from the first power supply 1400, the second power from the second power supply 3100, and the fifth power having the second voltage from the second power converter 2119 and outputs sixth power including the residual power, the second power, and the fifth power to the device under test DUT.

Figure 9:
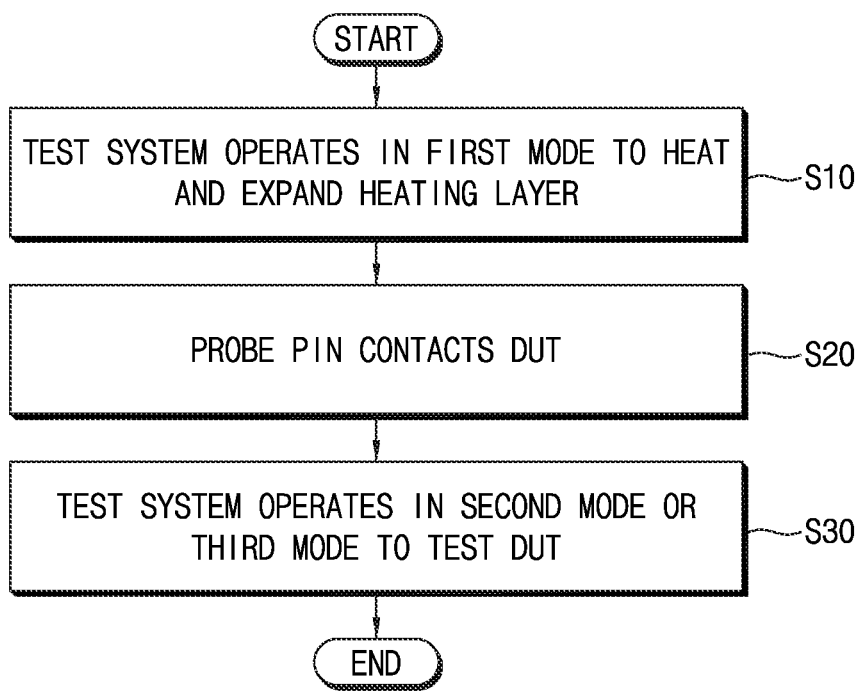
FIG. 9 is a flowchart illustrating a test method in the test system of the disclosure.

FIG. 9 is a flowchart illustrating a test method in the test system of the disclosure.

Referring to FIGS. 1 to 3 and FIGS. 5 to 9, the test system 100 may operate in the first mode to heat the heating layer HL and expand the sub-board 2120 (S10). After the sub-board 2120 expands and thus the probe pin 2300 is aligned with a pad of the device under test DUT, the wafer chuck 1100 may be raised to bring the probe pin 2300 into contact with the device under test DUT (S20). Then, the test system 100 may operate in the second mode and/or the third mode to test the device under test DUT (S30).

Figure 10:
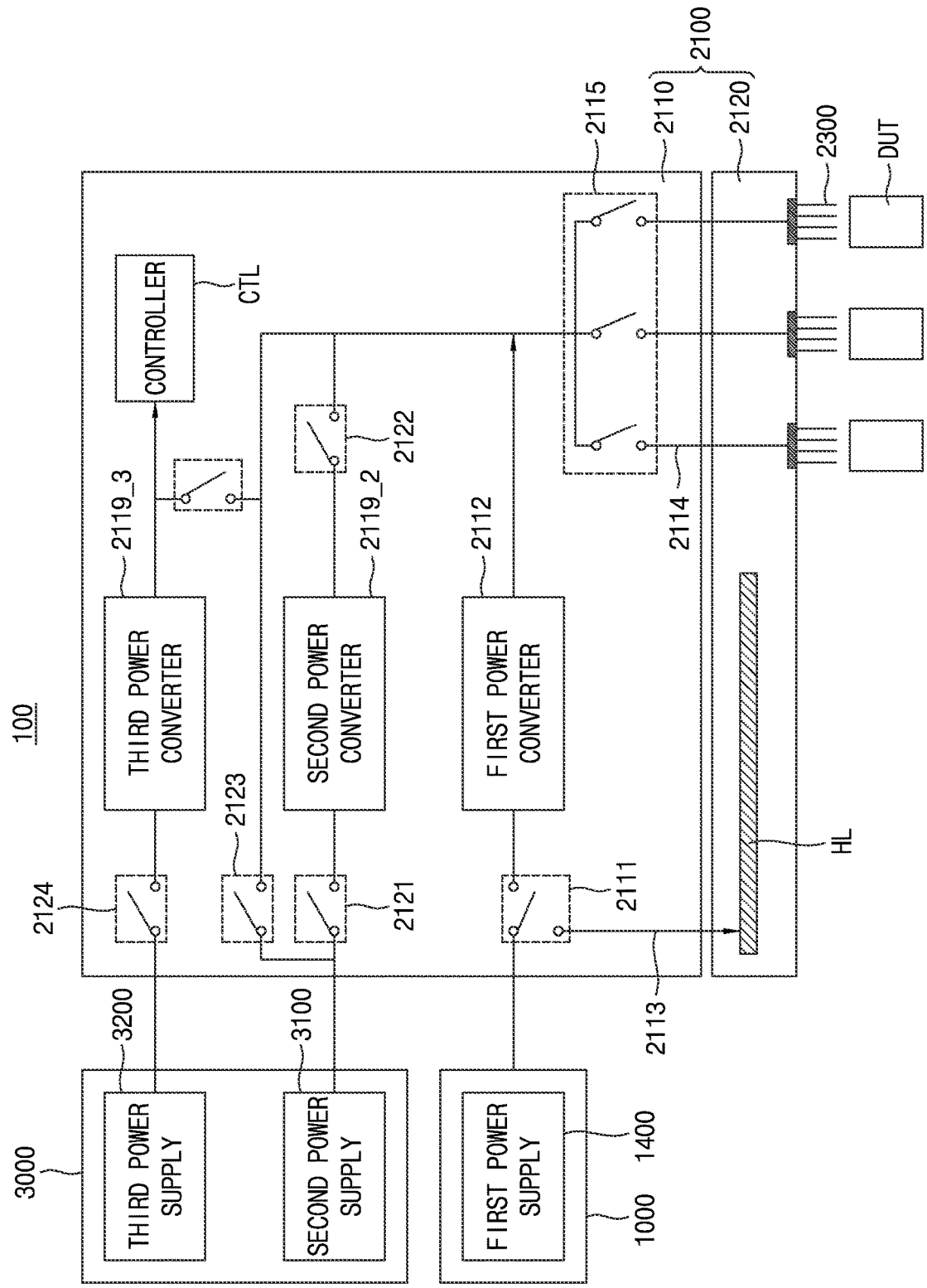
FIG. 10 is a diagram illustrating a test system according to an embodiment of the disclosure.

FIG. 10 is a diagram illustrating a test system according to an embodiment of the disclosure. In FIG. 10, the same reference numerals as those of FIGS. 3 and 5 to 8 denote the same components, and a description redundant to the foregoing descriptions will be avoided.

Referring to FIG. 10, the test system 100 differs from the test system 100 of FIG. 3 in that the ATE 3000 further includes the third power supply 3200, and the probe card 2000 further includes the controller CTL, a second power converter 21192, and a third power converter 2119_3. The test system 100 may further include third to seventh switch units 2121, 2122, 2123, 2124, and 2125. The third switch unit 2121 may be located between the second power supply 3100 and the second power converter 2119_2 and connected to the second power supply 3100 and the second power converter 2119_2. The fourth switch unit 2122 may be located between the second power converter 2119_2 and the second output terminal 2114 and connected to the second power converter 2119_2 and the second output terminal 2114. The fifth switch unit 2123 may be located between the second power supply 3100 and the second output terminal 2114 and connected to the second power supply 3100 and the second output terminal 2114. The sixth switch unit 2124 may be located between the third power supply 3200 and the third power converter 2119_3 and connected to the third power supply 3200 and the third power converter 2119_3. The seventh switch unit 2125 may be located between the third power converter 2119_3 and the second output terminal 2114 and connected to the third power converter 2119_3 and the second output terminal 2114.

In the first mode, the first switch unit 2111 may electrically connect the first power supply 1400 and the first output terminal 2113 to each other and open between the first power supply 1400 and the second power converter 2119_2. In the first mode, the first power supply 1400 may supply first power having a first voltage to the heating layer HL through the first switch unit 2111 and the first output terminal 2113.

In the second mode, the first switch unit 2111 may electrically connect the first power supply 1400 and the first power converter 2112 to each other. In the second mode, the first power supply 1400 and the heating layer HL may be open therebetween. In the second mode, the first power supply 1400 may supply the first power out of the total power of the first power supply 1400 to the heating layer HL and residual power to the first power converter 2112 through the first switch unit 2111. The residual power supplied to the first power converter 2112 may have the first voltage, and the first power converter 2112 may lower the first voltage of the residual power to a second voltage and supply the residual power having the second voltage to the second output terminal 2114.

In the second mode, the third switch unit 2121 and the fourth switch 2122 may be in the on-state, and the fifth switch unit 2123 may be in the off-state. That is, in the second mode, the third switch unit 2121 may electrically connect the second power supply 3100 and the second power converter 2119_2 to each other, and the fourth switch unit 2122 may electrically connect the second power converter 2119_2 and the second output terminal 2114 to each other. The fifth switch unit 2123 may open between the second power supply 3100 and the second output terminal 2114. In the second mode, the second power supply 3100 may supply second power having a third voltage to the third power converter 2119_3 through the third switch unit 2121. The third voltage may be higher than the second voltage. As the second power supply 3100 supplies the second power at the third voltage higher than the second voltage, the efficiency of power transfer to the probe card 2000 may be increased.

The second power converter 2119_2 may lower the third voltage of the second power to the second voltage and supply the second power having the second voltage to the second output terminal 2114. Therefore, in the second mode, the second output terminal 2114 may supply first combined power being the sum of the residual power having the second voltage received from the first power converter 2112 and the second power having the second voltage received from the second power converter 2119_2 to the device under test DUT. As the first combined power is supplied to the device under test DUT in the second mode, an AC test may be performed on the device under test DUT.

In the third mode, the first switch unit 2111 may electrically connect the first power supply 1400 and the first power converter 2112 to each other. In the third mode, the first power supply 1400 and the heating layer HL may be open therebetween. In the third mode, the first power supply 1400 may supply the first power out of the total power of the first power supply 1400 to the heating layer HL and the residual power to the first power converter 2112 through the first switch unit 2111. The residual power supplied to the first power converter 2112 may have the first voltage, and the first power converter 2112 may lower the first voltage of the residual power to the second voltage and supply the residual power having the second voltage to the second output terminal 2114.

In the third mode, the third switch unit 2121 and the fourth switch unit 2122 may be in the off-state, and the fifth switch unit 2123 may be in the on-state. That is, in the third mode, the third switch unit 2121 may open between the second power supply 3100 and the second power converter 2119_2, the fourth switch unit 2122 may open between the second power converter 2119_2 and the second output terminal 2114, and the fifth switch unit 2123 may electrically connect the second power supply 3100 and the second output terminal 2114 to each other. In the third mode, the second power supply 3100 may supply third power having the second voltage to the second output terminal 2114 through the fifth switch unit 2123. Accordingly, in the third mode, the second output terminal 2114 may supply second combined power being the sum of the residual power having the second voltage received from the first power converter 2112 and the third power having the second voltage received from the second power supply 3100 to the device under test DUT. As the second combined power is supplied to the device under test DUT in the third mode, the AC test may be performed on the device under test DUT.

According to an embodiment, in the second mode, the sixth switch unit 2124 and the seventh switch unit 2125 may be in the on-state, and the third power supply 3200 may further supply fourth power to the second output terminal 2114 through the third power converter 2119_3. The third power supply 3200 may supply the fourth power having a fourth voltage to the third power converter 21193 through the sixth switch unit 2124. The third power converter 21193 may convert the fourth voltage of the fourth power to the second voltage and supply the fourth power having the second voltage to the second output terminal 2114 through the seventh switch unit 2125. Accordingly, in the second mode, the second output terminal 2114 may supply third combined power being the sum of the first combined power and the fourth power having the second voltage to the device under test DUT.

According to an embodiment, in the third mode, the sixth switch unit 2124 and the seventh switch unit 2125 may be in the on-state, and the third power supply 3200 may further supply the fourth power to the second output terminal 2114 through the third power converter 2119_3. The third power supply 3200 may supply the fourth power having the fourth voltage to the third power converter 21193 through the sixth switch unit 2124. The third power converter 21193 may convert the fourth voltage of the fourth power to the second voltage and supply the fourth power having the second voltage to the second output terminal 2114 through the seventh switch unit 2125. Accordingly, in the third mode, the second output terminal 2114 may supply fourth combined power being the sum of the second combined power and the fourth power having the second voltage to the device under test DUT.

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure. An aspect of an embodiment may be achieved through instructions stored within a non-transitory storage medium and executed by a processor.

As is apparent from the foregoing description, according to embodiments of the disclosure, the test system may increase a power capacity required for testing a device under test by using an existing power supply without adding a new power supply.

While the disclosure has been particularly shown and described with reference to exemplary embodiments thereof, it will be apparent to those skilled in the art that various changes in form and detail may be made without departing from the spirit and essential characteristics of the disclosure. The above embodiments are therefore to be construed in all aspects as illustrative and not restrictive.

What is claimed is:

1. A probe card comprising:
a sub-board including a heating layer and connected to a probe pin; and
a main board connected to the sub-board and including:
   a first output terminal configured to output first power received from a first power supply to the heating layer in a first mode;
   a power converter configured to lower a first voltage corresponding to residual power received from the first power supply to a second voltage and output the residual power having the second voltage in a second mode;
   a second output terminal configured to receive the residual power from the power converter and second power from a second power supply and output third power including the residual power and the second power to a device under test in the second mode; and
   a first switch unit connected to the first power supply, the first output terminal, and the power converter,
wherein:
the first switch unit is selectively switched to:
   the first mode in which the first switch unit electrically connects the first power supply and the heating layer to each other, and
   the second mode in which the first switch unit electrically connects the first power supply and the power converter to each other.

2. The probe card according to claim 1, further comprising:
a second switch unit connected to the second output terminal, wherein
the second switch unit is in an off-state in the first mode and in an on-state in the second mode.

3. The probe card according to claim 1, wherein:
during a first period, as the first switch unit operates in the first mode, the first power supply applies the first voltage to the heating layer through the first output terminal to heat and expand the sub-board, and
during a second period after the first period, as the first switch unit operates in the second mode, the second power supply and the power converter apply the second voltage to the device under test through the second output terminal to test the device under test.

4. The probe card according to claim 1, wherein the sub-board and the main board are connected to each other through an interposer.

5. The probe card according to claim 1, wherein the sub-board includes ceramic and the heating layer includes a metal.

6. The probe card according to claim 1, further comprising:
a third output terminal configured to receive fourth power from a third power supply and output the fourth power to the device under test in a third mode, wherein:
the first switch unit electrically connects the first power supply and the power converter to each other in the third mode, and
the power converter lowers the first voltage corresponding to the residual power received from the first power supply to a third voltage corresponding to the fourth power and applies the third voltage to the third output terminal in the third mode.

7. The probe card according to claim 6, wherein the third output terminal receives the residual power from the power converter and the fourth power from the third power supply and outputs fifth power including the residual power and the third power to the device under test in the third mode.

8. The probe card according to claim 6, further comprising:
a third switch unit connecting the power converter to the second output terminal; and
a fourth switch unit connecting the power converter to the third output terminal, wherein:
the third switch unit is in an on-state and the fourth switch unit is in an off-state, in the second mode; and
the third switch unit is in the off-state and the fourth switch unit is in the on-state, in the third mode.

9. The probe card according to claim 8, wherein:
during a first period, as the first switch unit operates in the first mode, the first power supply applies the first voltage to the heating layer through the first output terminal to heat and expand the sub-board,
during a second period after the first period, as the first switch unit, the third switch unit, and the fourth switch unit operate in the second mode, the power converter and the second power supply apply the second voltage to the device under test through the second output terminal to test the device under test, and
during a third period after the second period, as the first switch unit, the third switch unit, and the fourth switch unit operate in the third mode, the power converter and the third power supply apply the third voltage to the device under test through the third output terminal to test the device under test.

10. A test system including the probe card according to claim 1, further comprising:
a prober including the first power supply and a test head connected to the probe card and having the device under test disposed thereon; and
an automated test equipment (ATE) including the second power supply and electrically connected to the prober.

11. The test system according to claim 10, wherein the second power supply applies the second voltage to the probe card through the test head.

12. A test system comprising:
a prober including a first power supply;
an automated test equipment (ATE) including a second power supply; and
a probe card including:
a heating layer;
a probe pin;
a first output terminal configured to output first power having a first voltage received from the first power supply to the heating layer in a first mode;
a first power converter configured to lower the first voltage corresponding to residual power received from the first power supply to a second voltage and output the residual power having the second voltage in a second mode; and
a second output terminal configured to receive the residual power having the second voltage from the first power converter and second power having the second voltage from the second power supply and output third power including the residual power and the second power to a device under test through the probe pin.

13. The test system according to claim 12, wherein:
the probe card further includes a first switch unit connected to the first power supply, the first output terminal, and the first power converter, and
the first switch unit is selectively switched to:
the first mode in which the first switch unit electrically connects the first power supply and the heating layer to each other, and
the second mode in which the first switch unit electrically connects the first power supply and the first power converter to each other.

14. The test system according to claim 12, wherein the probe card further includes a controller configured to control the probe card to operate in one of the first mode and the second mode.

15. The test system according to claim 14, wherein:
the ATE further includes a third power supply configured to supply fourth power to the controller and supply fifth power to the second output terminal in the second mode, and
the probe card further includes a second power converter configured to convert a third voltage corresponding to the fifth power received from the third power supply to the second voltage in the second mode.

16. The test system according to claim 15, wherein the second output terminal receives the residual power, the second power, and the fifth power having the second voltage output from the second power converter and outputs sixth power including the residual power, the second power, and the fifth power in the second mode.

17. The test system according to claim 12, wherein the prober or the ATE further includes a controller configured to control the probe card to operate in one of the first mode and the second mode.

18. The test system according to claim 12, wherein:
the ATE further includes a third power supply configured to supply fourth power having a third voltage to the probe card in a third mode, and
the probe card further includes:
 a second power converter configured to lower the first voltage corresponding to the residual power received from the first power supply to the third voltage in the third mode; and
 a third output terminal configured to:
  receive the residual power having the third voltage from the second power converter and the fourth power having the third voltage from the third power supply, and
  output fifth power including the residual power and the fourth power to the device under test through the probe pin.

19. The test system according to claim 18, wherein:
during a first period, as the probe card operates in the first mode, the first power supply applies the first voltage to the heating layer through the first output terminal to heat the heating layer, and
during a second period after the first period, as the probe card operates in the third mode, the second power converter and the third power supply apply the third voltage to the device under test through the third output terminal to test the device under test.

20. A test system comprising:
a prober including a first power supply;
an automated test equipment (ATE) including a second power supply and a third power supply; and
a sub-board including: (1) a heating layer therein and connected to a probe pin and (2) a main board connected to the sub-board through an interposer, wherein:
the main board includes:
 a first output terminal configured to output first power having a first voltage received from the first power supply to the heating layer in a first mode;
 a first power converter configured to lower the first voltage corresponding to residual power received from the first power supply to a second voltage in a second mode;
 a second output terminal configured to receive the residual power having the second voltage from the first power converter and second power from the second power supply and output third power including the residual power and the second power to a device under test through the probe pin in the second mode;
 a second power converter configured to lower the first voltage corresponding to the residual power received from the first power supply to a third voltage in a third mode;
 a third output terminal configured to receive the residual power having the third voltage from the second power converter and fourth power from the third power supply and output fifth power including the residual power and the fourth power to the device under test through the probe pin in the third mode;
 a first switch unit connected to the first power supply, the first output terminal, and the first power converter; and
 a second switch unit connected to the first power supply and the second power converter, and
after the first switch unit operates in the first mode in which the first switch unit electrically connects the first power supply and the first output terminal to each other, the first switch unit operates in the second mode in which the first switch unit electrically connects the first power supply and the first power converter to each other or in the third mode in which the first switch unit electrically connects the first power supply and the second power converter to each other.

21. A probe card comprising:
a first power converter that converts first power having a first voltage to a second voltage or a third voltage, each of the second voltage and the third voltage differing from the first voltage;
a first switch that conveys the first power, having the first voltage, from a first power supply to:
 a heating element in a first mode of operation but not in a second mode of operation, and
 the first power converter in the second mode of operation but not in the first mode of operation; and
a first node that combines second power, having the second voltage, received from a second power supply with the first power, having the second voltage, received from the first power converter to create first combined power.

22. The probe card of claim 21, further comprising a second switch that conveys the first combined power to a device under test during the second mode of operation but not the first mode of operation.

23. The probe card of claim 22, further comprising a third switch that conveys the first power, having the second voltage, received from the first power converter to the first node during the second mode of operation but not the first mode of operation or a third mode of operation.

24. The probe card of claim 23, further comprising:
a second node that combines third power, having the third voltage, received from a third power supply with the first power, having the third voltage, received from the first power converter to create second combined power; and
a fourth switch that conveys the first power, having the third voltage, received from the first power converter to the second node during the third mode of operation but not the first mode of operation or the second mode of operation.

25. The probe card of claim 21, further comprising:
a second power converter that converts the first power having the first voltage to the third voltage;
a second switch that conveys the first power, having the first voltage, from the first power supply to the second power converter in a third mode of operation but not in the first mode of operation or the second mode of operation; and
a second node that combines third power, having the third voltage, received from a third power supply with the first power, having the third voltage, received from the second power converter to create second combined power.

26. The probe card of claim 25, further comprising a third switch that conveys:
the first combined power to a device under test during the second mode of operation but not the first mode of operation or the third mode of operation, and
the second combined power to the device under test during the third mode of operation but not the first mode of operation or the second mode of operation.

27. The probe card of claim 21, further comprising:
a second power converter that converts third power having the third voltage to the second voltage; and a second switch that conveys the third power, having the third voltage, from a third power supply to the second power converter in the second mode of operation but not in the first mode of operation, wherein the first node combines the first combined power with the third power, having the second voltage, received from the third power converter to create second combined power.

28. The probe card of claim 27, further comprising a third switch that conveys the second combined power to a device under test during the second mode of operation but not the first mode of operation.

\* \* \* \* \*